United States Patent
Zhao

(10) Patent No.: US 7,195,501 B2
(45) Date of Patent: Mar. 27, 2007

(54) CARD CONNECTOR WITH EJECTOR

(75) Inventor: Sen-Bing Zhao, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/300,932

(22) Filed: Dec. 15, 2005

(65) Prior Publication Data

US 2007/0010114 A1    Jan. 11, 2007

(51) Int. Cl.
  *H01R 13/62* (2006.01)
(52) U.S. Cl. .................................................. 439/159
(58) Field of Classification Search ............... 439/159, 439/160, 328, 157, 131, 153–158, 258
See application file for complete search history.

(56) References Cited

U.S. PATENT DOCUMENTS 6,315,583 B1 * 11/2001 Nishioka .................. 439/131
6,319,029 B2 * 11/2001 Nishioka .................. 439/159
6,488,528 B2 * 12/2002 Nishioka .................. 439/489

* cited by examiner

*Primary Examiner*—J. F. Duverne
(74) *Attorney, Agent, or Firm*—Wei Te Chung

(57) ABSTRACT

A card connector includes an insulating housing (10), a number of contacts (20) and an ejector (30). The insulating housing (10) defines a card receiving space (13) with a card insertion/ejection direction. The contacts (20) comprises a number of contacting portions (23) exposed into the card receiving space (13) and arranged in two rows along the card insertion/ejection direction to electrically connect with a card. The ejector (30) includes a slider (31) moving along the card insertion/ejection direction with the card inserted/ejected, an ejecting arm (323) protruding into the card receiving space (13) to eject the card, holding means to securely hold the slider (31) in a final position, and a resilient member (34) disposed in the slider to urge the slider (31) to move along the card ejection direction.

10 Claims, 5 Drawing Sheets

CARD CONNECTOR WITH EJECTOR

BACKGROUND OF THE INVENTION

1. Field of the Invention

The present invention is generally related to a card connector, and especially to a card connector which is adapted for insertion/ejection of a card.

2. Description of Related Art

Integrated circuit (IC) cards are used in a variety of appliances in conjunction with corresponding card connectors. One type of IC cards is commonly termed a "subscriber's identification module" or SIM card. A SIM card is a miniature chip card for use in small hand-held devices such as pocket size cellular telephones. The SIM card may provide information such as user identification in individual telephone handsets. SIM card connectors have been developed to accommodate insertion or removal of the SIM card and to provide quick identification and easy access by a cellular telephone user.

However, the SIM card is usually inserted into or drawn out of the SIM card connector by hand. Therefore, one consequence of the manual insertion and removal of a SIM card is that a user or a subscriber can't always assure that the SIM card is fully and accurately inserted. It is futile if the SIM card is improper positioned. Furthermore, the small and fragile SIM card can be damaged when improperly inserted or removal since it is constantly subjected to human handing and extraneous forces.

On the other hand, the SIM card is usually accommodated in the devices such as telephone handsets. If a user wants to removal the SIM card, the user has to disassemble the telephone handsets. Thus, it is inconvenience to do this.

Hence, an improved card connector is highly desired to overcome the aforementioned disadvantages of the prior art.

SUMMARY OF THE INVENTION

Accordingly, an object of the present invention is to provide a card connector which has an ejector for inserting/ejecting a card conveniently.

To achieve the above object, a card connector adapted for receiving a card comprises an insulating housing, a plurality of contacts and an ejector. The insulating housing defines a card receiving space with a card insertion/ejection direction. The contacts is retained in the insulating housing and comprises a plurality of contacting portions exposed into the card receiving space and arranged in two rows along the card insertion/ejection direction to electrically connect with a card. The ejector is assembled to the insulating housing and comprises a slider moving along the card insertion/ejection direction with the card inserted/ejected, an ejecting arm disposed in the slider and protruding into the card receiving space to eject the card, holding means to securely hold the slider in a final position where the card is electrically connected with the contacts and to release the slider from the final position when ejecting the card, and a resilient member disposed in the slider to urge the slider to move along the card ejection direction.

Other objects, advantages and novel features of the present invention will be drawn from the following detailed description of a preferred embodiment of the present invention with attached drawings.

DETAILED DESCRIPTION OF THE INVENTION

Figure 1:
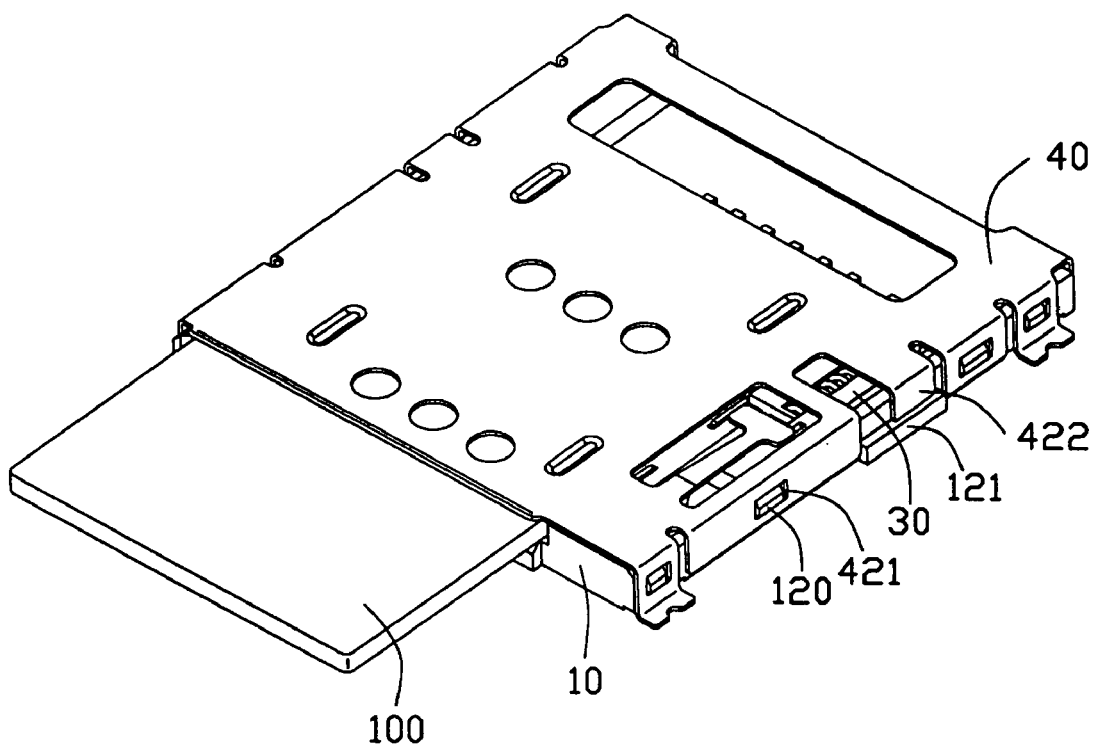
FIG. 1 is an assembled, perspective view of a card connector in accordance with the present invention with a card accommodated therein.

Reference will now be made in detail to the preferred embodiment of the present invention.

Referring to FIGS. 1–5, the card connector in accordance with the present invention is adapted for receiving a card 100, such as a SIM card. The card connector comprises an insulating housing 10, a plurality of contacts 20 received in the insulating housing 10, an ejector 30 and a shell 40 covering the insulating housing 10.

Figure 2:
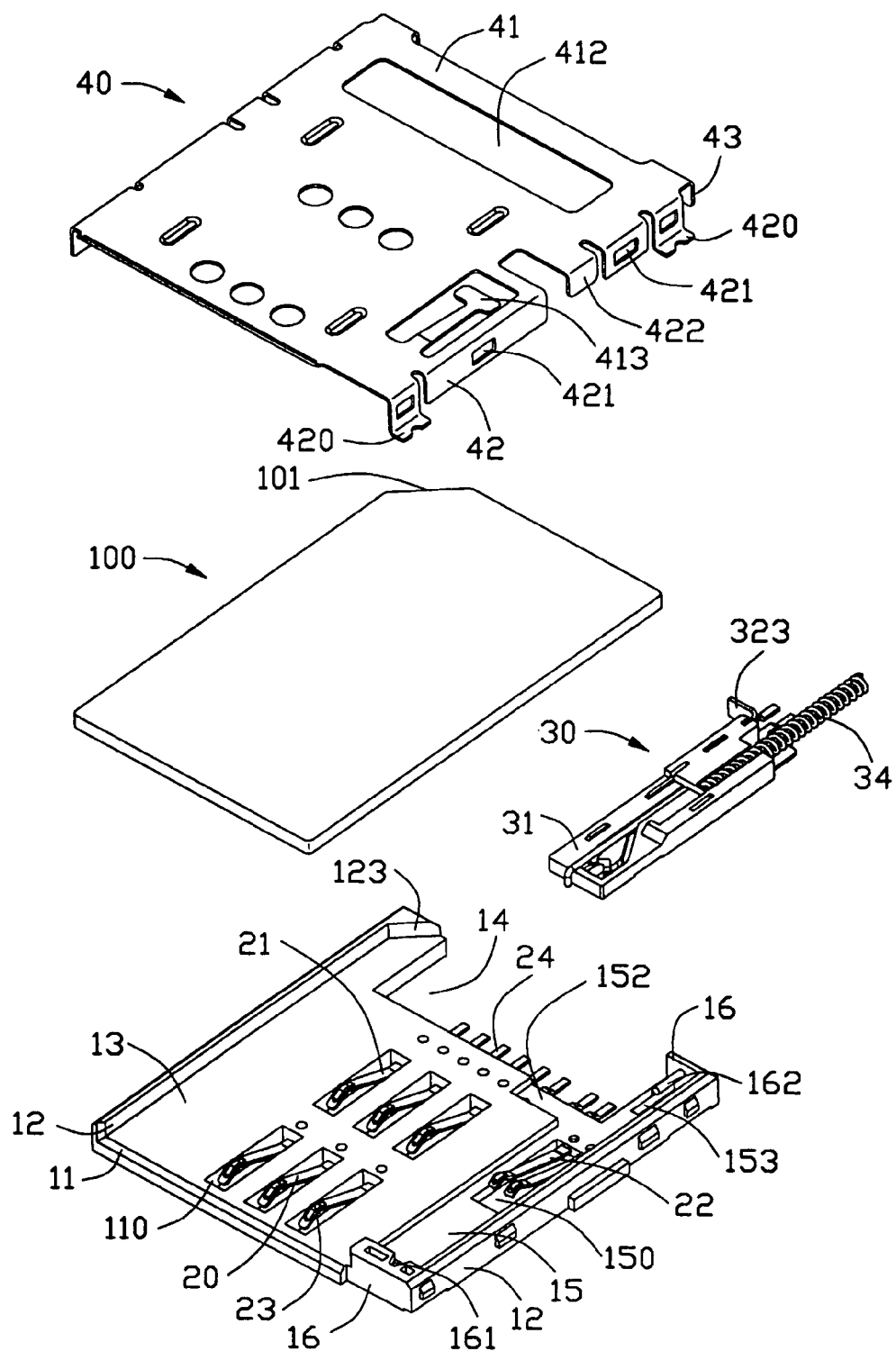
FIG. 2 is an exploded, perspective view of the card connector of FIG. 1.

Referring to FIG. 2, the insulating housing 10 is approximately frame configuration. The insulating housing 10 comprises a bottom wall 11 and a pair of opposite right and left sidewalls 12 extending upwardly from lateral sides of the bottom wall 13, which commonly define a card receiving space 13 for accommodating the SIM card 100. The bottom wall 11 defines an opening 14 at rear end thereof and is formed with a plurality of rectangular receiving passages 110 arranged in two rows along a card insertion/ejection direction. The right and left sidewalls 12 are formed with a plurality of wedges 120 on outsides thereof, respectively. A pair of protruding blocks 121 protrude outwardly from lower sides of the opposite sidewalls 12, respectively.

The contacts 20 are divided into two groups which are insert-molded with the insulating housing 10, respectively. Each contact 20 comprises a contacting portion 23 received in the corresponding receiving passage 110 and partially exposed into the card receiving space 13, an intermediate portion (not labeled) extending rearward from the contacting portion 23 and molded in the insulating housing 10 and a soldering portion 24. The soldering portion 24 extends rearward from the intermediate portion to expose into the opening 14.

The right sidewall 12 of the insulating housing 10 is formed with a pair of front and rear walls 16 at front and rear ends thereof, together defining a rectangular receiving concave 15 communicating with the card receiving space 13 along the card insertion direction for accommodating the ejector 30. The bottom wall 11 defines a recess 152 at rear end thereof faced to the opening 14 to communicate with the receiving concave 15. A column 162 protrudes forwardly from the rear wall 16 and is exposed into the concave 15. A downwardly recessed hole 153 is formed on the right sidewall 12 in alignment with the column 162 along a vertical direction perpendicular to the card insertion direction.

The right sidewall 12 defines a rectangular recess section 150 downwardly recessed from a bottom face of the receiving concave 15 and locating approximately in middle of the receiving concave 15. A pair of grounding terminals 22 are insert-molded with the insulating housing 10 with contacting portions (not labeled) received in the rectangular hole 150 and partially exposed into the concave 15. Tail portions of the grounding terminals 22 are exposed into the opening 14 to align with the soldering portions 24 of the contacts 20.

Figure 3:
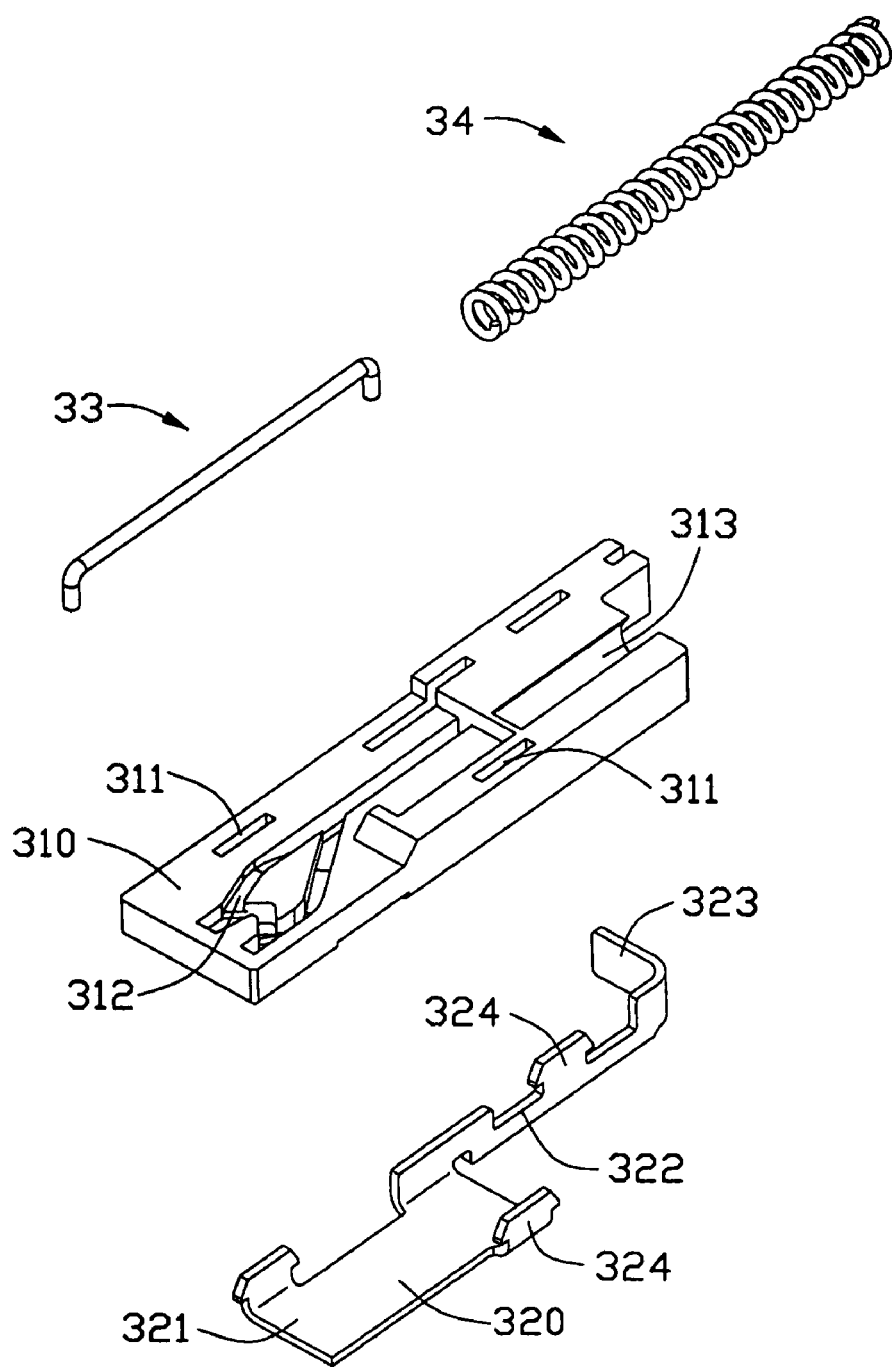
FIG. 3 is an exploded, perspective view of an ejector of the card connector of FIG. 1.
Figure 4:
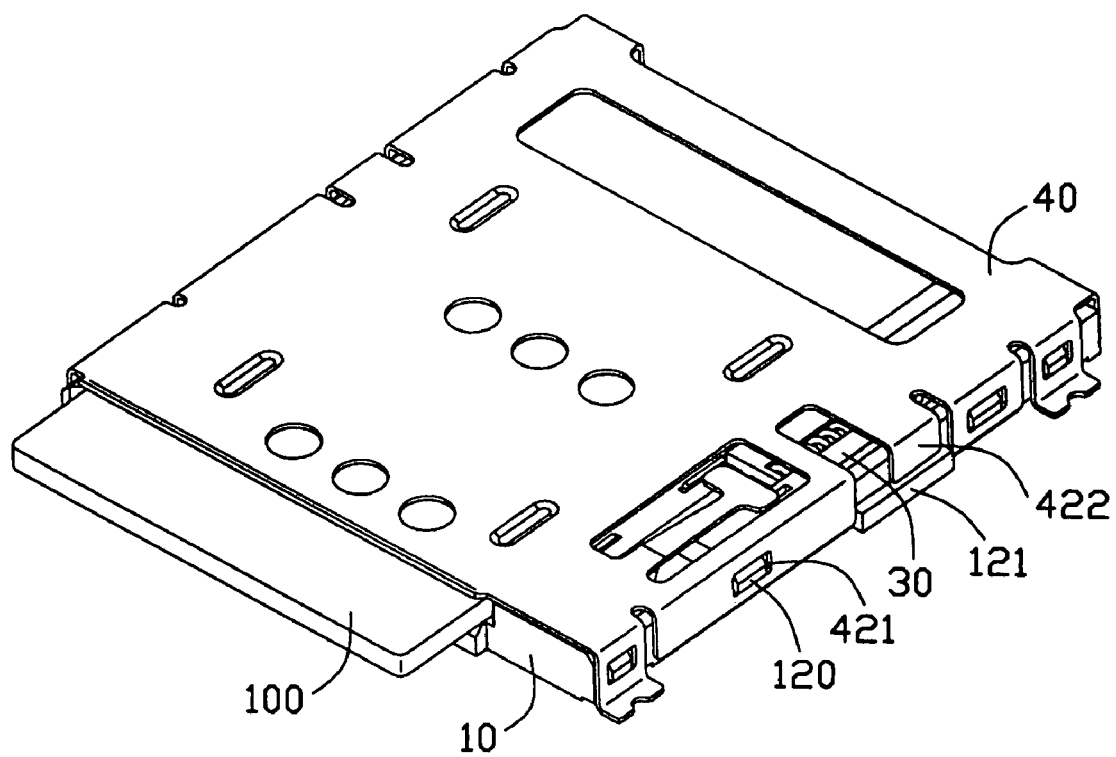
FIG. 4 is a perspective view similar to FIG. 1, showing insertion status of a card.
Figure 5:
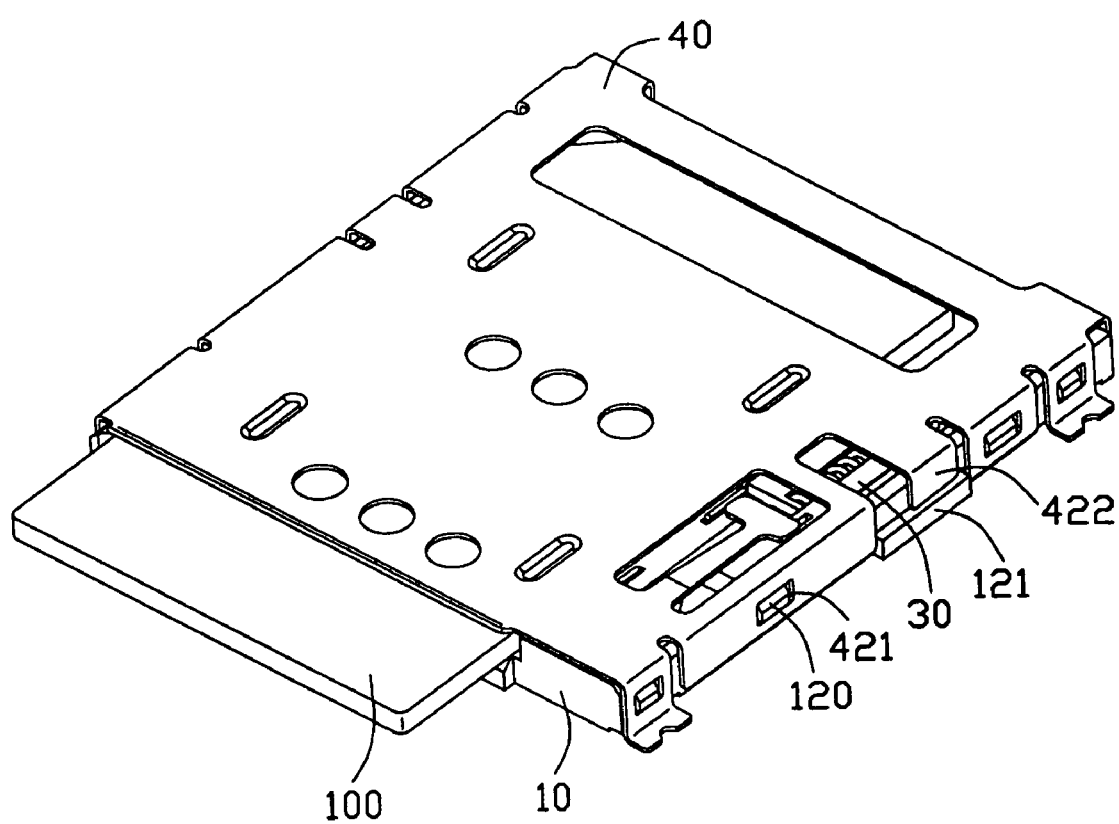
FIG. 5 is a perspective view similar to FIG. 1, showing ejection status of the card.

Referring to FIGS. 2 and 3, the ejector 30 is used for ejecting the SIM card 100 out of the card connector. The ejector 30 comprises a slider 31, a pin member 33, a resilient member 34 and an ejecting member 320 for contacting and ejecting the SIM card 100 directly. In this embodiment, the resilient member 34 is a spring and the ejecting member 320 is a separate component. However, the ejecting member 320 also can be unitary with the slider 31 on condition that the ejecting member 320 can protrude into the card receiving space 13 to eject the SIM card 100.

The slider 31 is approximately an elongated cube configuration and can move along the card insertion and ejection direction with the SIM card 100 inserted and ejected. The slider 31 defines a heart-shaped slot 312 recessed downwardly from a top face thereof, a semi-circular receiving hole 313 recessed forwardly from a rear face thereof and a plurality of through slots 311 recessed downwardly from a top face to a bottom face of lateral sides of the slider 31. One end of the spring 34 is disposed around the column 162 of the rear wall 16 and the other end is disposed into the receiving hole 313 of the slider 31. One end of the pin member 33 is moveably disposed in the heart-shaped slot 312 of the slider 31 and the other end is securely locked in a pinhole 161 of the front wall 16 of insulating housing 10. The pin member 33 and the heart-shaped slot 312 are referred as holding means and can hold the slider 31 in a final position where the card 100 is electrically connected with the card connector and can release the slider 31 when ejecting the card 100.

The ejecting member 320 is stamped from a metal sheet. The ejecting member 320 comprises a horizontal plate 321 and a holding arm 322 extending upward and rearward from rear end of one side of the horizontal plate 321 adjacent to the card receiving space 13. A plurality of hooks 324 protrudes upwardly from the holding arm 322 and lateral sides of the horizontal plate 321, respectively. In addition, the holding arm 322 is formed with a rectangular plate-shaped ejecting arm 323 bent from a free end thereof and protruding into the card receiving space 13 to locate above the recess 152 of the bottom wall 11. The ejecting member 320 is securely assembled to a bottom face of the slider 31 with the hooks 324 interferencely received in the through slots 311 of the slider 31.

Referring to FIGS. 1 and 2, the shell 40 is made of metal sheet to cover the housing 10. The shell 40 comprises a base portion 41 and a pair of opposite right and left side portions 42 extending downwardly from lateral sides of the base portion 41. A rectangular cut 412 is defined in rear end of the base potion 41 to communicate with the opening 14 of the insulating housing 10. Furthermore, the base portion 41 is formed with a pair of holding pieces 43 extending downwardly from lateral sides of rear end thereof to abut against rear end of the insulating housing 10 and a T-shaped resilient piece 413 at front end thereof adjacent to the right side portion 42 for pressing downwardly against the pin member 33 in the heart-shaped slot 312 of the slider 31 of the ejector 30. Each side portion 42 is formed with a plurality of mating holes 421 for receiving the wedges 120 of the insulating housing 10 and a pair of soldering feet 420 on opposite distal ends along the card insertion direction for being mounted on a printed circuit board (not shown). An engaging piece 422 extends from the base portion 41 to expose into a gap (not labeled) defined in each side portion 42 to mate with the corresponding protruding block 121. Thus, the shell 40 is securely assembled to the insulating housing 10.

The SIM card 100 defines a cutout 101 in a corner between a rear end and a left side thereof. The left sidewall 12 of the insulating housing 10 is formed with a slanting face 123 faced to the card receiving space 13 at rear end thereof to recognize the cutout 101 in order to prevent the SIM card 100 from mismating. In process of the SIM card 100 inserting into the card connector, the card 100 collides with the ejecting arm 323 of the ejector 30 to drive the slider 31 to move along the card insertion direction and to urge the spring 34 to elastically distort. In the meantime, the pin member 33 moves along the heart-shaped slot 312 of the ejector 30 to make the slider 31 finally achieve a final position or a locking position where the card 100 is electrically connected with the contacts 20 accurately and fully. In addition, the grounding terminals 22 are electrically connected with the horizontal plate 321 of the ejecting member 320 of the ejector 30 to discharge static.

When ejecting the card 100, a rearward push force is exerted to the card 100 to make the pin member 33 move along the heart-shaped slot 312 again so as to release the slider 31 from the final position. At this time, the resilient restorable force of the spring 34 urges the slider 31 to move along the card ejection direction so as to eject the card 100 out of the card connector in virtue of the ejecting arm 323 of ejector 30 pushing the card 100 and the slider 31 to its original position.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A card connector adapted for receiving a card, comprising:

an insulating housing defining a card receiving space with a card insertion/ejection direction;

a plurality of contacts retained in the insulating housing and comprising a plurality of contacting portions exposed into the card receiving space and arranged in two rows along the card insertion/ejection direction to electrically connect with the card; and an ejector assembled to the insulating housing and comprising a slider moving along the card insertion/ejection direction with the card inserted/ejected, an ejecting arm disposed in the slider and protruding into the card receiving space to eject the card, holding means to securely hold the slider in a final position where the card is electrically connected with the contacts and to release the slider from the final position when pushing the card along the card insertion direction from the final position, and a resilient member disposed in the slider to urge the slider to move along the card ejection direction.

2. The card connector as described in claim 1, wherein the resilient member is a spring.

3. The card connector as described in claim 1, wherein the holding means comprises a pin member and a heart-shaped slot disposed in the slider, and wherein one end of the pin member is assembled to the insulating housing and the other end is moveably disposed in the heart-shaped slot.

4. The card connector as described in claim 1, wherein the ejector comprises an ejecting member assembled to the slider, and wherein the ejecting member comprises a horizontal plate, a holding arm extending from the horizontal plate.

5. The card connector as described in claim 4, wherein the ejecting member is formed with a plurality of hooks interferencely received in corresponding through slots of the slider.

6. The card connector as described in claim 4, wherein the ejecting arm extends from a free end of the holding arm.

7. The card connector as described in claim 6, wherein the ejecting member is stamped from a metal sheet.

8. The card connector as described in claim 7, further comprising grounding terminals to electrically connect with the horizontal plate of the ejecting member when the slider is in the final position.

9. The card connector as described in claim 1, wherein the insulating housing defines an opening at rear end thereof, and wherein soldering portions of the contacts are exposed into the opening.

10. The card connector as described in claim 1, further comprising a shell covering the insulating housing.

* * * * *